US009179582B2

(12) United States Patent
Chang

(10) Patent No.: US 9,179,582 B2
(45) Date of Patent: Nov. 3, 2015

(54) ELECTRONIC DEVICE WITH CONNECTORS AND FASTENERS FOR ALIGNMENT OF THE CONNECTORS

(71) Applicant: HON HAI PRECISION INDUSTRY CO., LTD., New Taipei (TW)

(72) Inventor: Chun-Yuan Chang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 103 days.

(21) Appl. No.: 14/093,045

(22) Filed: Nov. 29, 2013

(65) Prior Publication Data

US 2015/0109743 A1 Apr. 23, 2015

(30) Foreign Application Priority Data

Oct. 23, 2013 (TW) .............................. 102138175 A

(51) Int. Cl.
  *H05K 7/00* (2006.01)
  *H05K 9/00* (2006.01)
  *H05K 5/02* (2006.01)
  *H05K 7/14* (2006.01)
  *H01R 13/6583* (2011.01)

(52) U.S. Cl.
  CPC ............ *H05K 9/0018* (2013.01); *H05K 5/0247* (2013.01); *H05K 7/142* (2013.01); *H01R 13/6583* (2013.01)

(58) Field of Classification Search
  USPC ............ 361/679.01, 747, 748, 784, 796, 801, 361/774, 752, 805, 736, 807, 809, 810; 174/138 E, 138 G
  See application file for complete search history.

(56) References Cited

U.S. PATENT DOCUMENTS

| | | | | |
|---|---|---|---|---|
| 4,672,510 A | * | 6/1987 | Castner | 361/679.32 |
| 5,443,390 A | * | 8/1995 | Kokkosoulis et al. | 439/76.1 |
| 6,781,055 B2 | * | 8/2004 | Chen | 174/535 |
| 7,227,761 B2 | * | 6/2007 | Estes et al. | 361/810 |
| 7,358,438 B2 | * | 4/2008 | Zoller | 174/50 |
| 7,916,490 B2 | * | 3/2011 | Yeh et al. | 361/752 |
| 7,983,057 B2 | * | 7/2011 | Zheng et al. | 361/810 |

FOREIGN PATENT DOCUMENTS

| | | |
|---|---|---|
| TW | 239911 | 2/1995 |
| TW | M429967 U1 | 5/2012 |
| TW | M453685 U1 | 8/2013 |

\* cited by examiner

*Primary Examiner* — Hung S Bui
(74) *Attorney, Agent, or Firm* — Novak Druce Connolly Bove + Quigg LLP

(57) ABSTRACT

An exemplary electronic device with connectors and fasteners for alignment of the connectors includes a panel, a printed circuit board, and a shell. The printed circuit board includes a number of connectors arranged thereon. A number of holes are defined in the shell for expose the connectors. The printed circuit board defines a number of through holes therein. The panel defines a number of positioning holes therein. The shell forms a number of positioning posts thereon, and each positioning post defines an engaging hole therein. The present disclosure also includes a number of fasteners. Each fastener includes a first and a second positioning part. The first positioning part inserts through a corresponding through hole and a corresponding positioning hole to connect the printed circuit board and the panel. The second positioning part is engagingly received in the engaging hole of a corresponding positioning post of the shell.

10 Claims, 5 Drawing Sheets

ELECTRONIC DEVICE WITH CONNECTORS AND FASTENERS FOR ALIGNMENT OF THE CONNECTORS

BACKGROUND

1. Technical Field

The disclosure relates to an electronic device having a printed circuit board, together with fasteners which are able to align connectors secured on the printed circuit board.

2. Description of Related Art

Electrical connectors are used in numerous fields such as electronic products and industrial computers. For instance, a printed circuit board with connectors arranged thereon is fixed in a panel of a portable electronic device such as a handheld computer. The panel of the computer includes a support and a shell engaged with each other. The printed circuit board is secured on the support and located between the support and the shell. A plurality of holes are defined in the shell for the connectors to extend therethrough. However, after the printed circuit board is fixed on the support, the locations of the connectors may deviate from the locations of the corresponding holes of the shell. When this happens, one or more of the connectors may not be able to be inserted through the corresponding hole(s).

Therefore, it is desirable to provide an electronic device having means for securing a printed circuit board which can overcome the above-described limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of an exemplary electronic device. Moreover, in the drawings, like reference numerals designate corresponding parts throughout the several views.

DETAILED DESCRIPTION OF EMBODIMENTS

Figure 1:
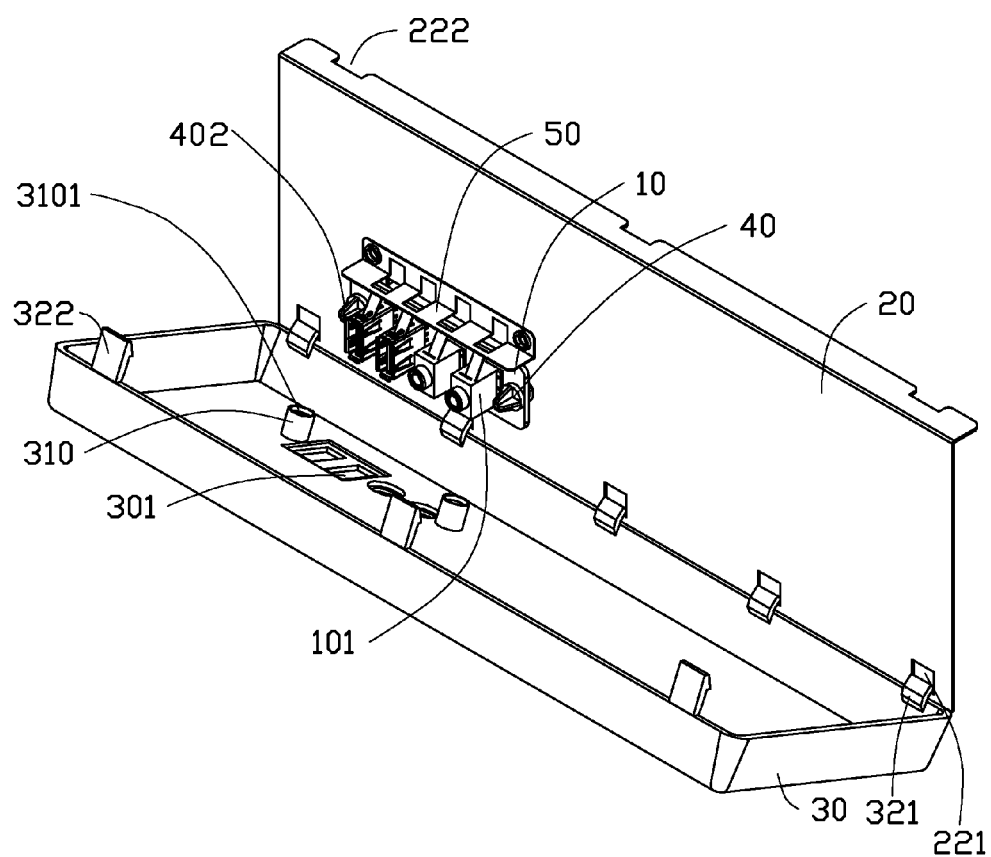
FIG. 1 is an isometric view of an exemplary electronic device of the present disclosure, showing a panel of the electronic device opened out.
Figure 2:
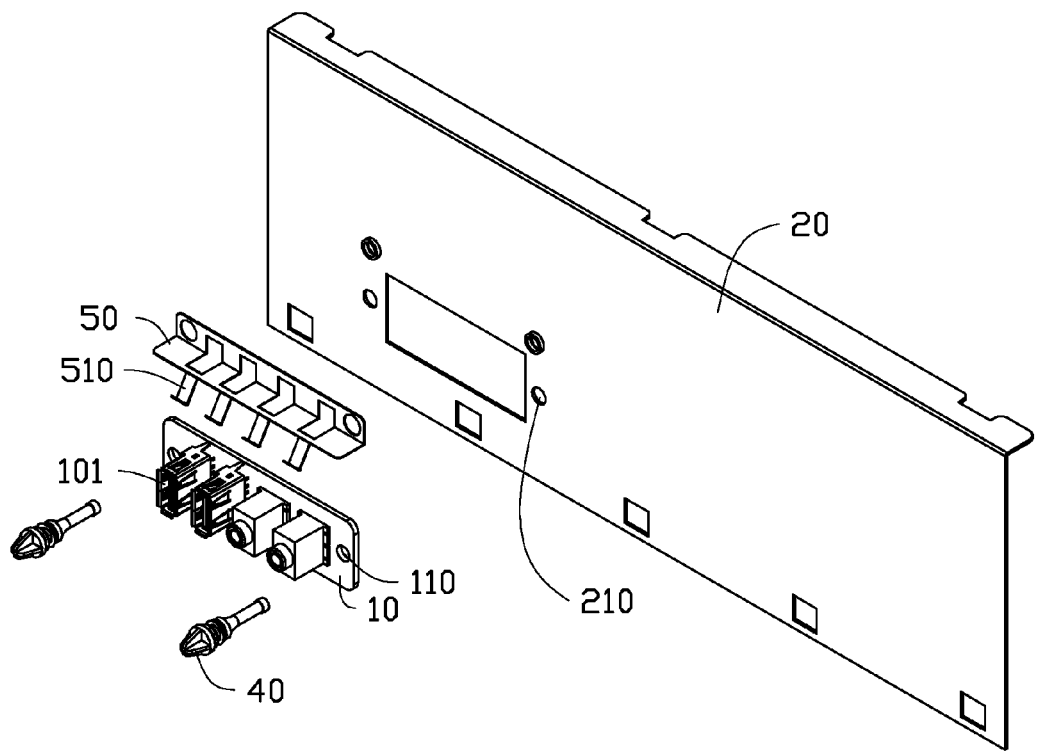
FIG. 2 is a fully exploded view of the panel and associated components of FIG. 1.

Referring to FIG. 1 and FIG. 2, an exemplary electronic device with connectors and fasteners for alignment of the connectors includes a panel 20, a printed circuit board 10 fixed on the panel 20, and a shell 30 combined with the panel 20.

The panel 20 and the shell 30 cooperatively form an enclosure of the electronic device. The electronic device may for example be a computer, a display device, a router or a set-top box, etc. The panel 20 defines a plurality of positioning holes 210.

The printed circuit board 10 is fixed on the panel 20. A set of jacks (not labeled) and bonding pads (not labeled) are formed on the printed circuit board 10, and the jacks and the bonding pads are electrically connected with a plurality of connectors 101 or other electronic components (not shown).

The connectors 101 can be Universal Serial Bus (USB) connectors, High Definition Multimedia Interface (HDMI) connectors, Institute of Electrical and Electronics Engineers (IEEE) connectors, audio connectors, External Serial Advanced Technology Attachment (ESATA) connectors, or optical fiber connectors, etc. The electronic components can be light-emitting diodes (LEDs), buttons, or rotary knobs, etc. The printed circuit board 10 defines a plurality of through holes 110 therein. Each through hole 110 corresponds to and is aligned with a respective positioning hole 210.

The shell 30 is combined with the panel 20 and covers the printed circuit board 10. A plurality of holes 301 are defined in the shell 30, for the connectors 101 on the printed circuit board 10 to extend through and be exposed out of the shell 30. In other words, the holes 301 of the shell 30 correspond to the connectors 101. The shell 30 forms a plurality of positioning posts 310 thereon, and each positioning post 310 defines an engaging hole 3101 therein. The positioning posts 310 are formed on an inside of the shell 30. In other words, the positioning posts 310 are formed on a surface of the shell 30 facing the printed circuit board 10 and the panel 20. The geometric centers of the positioning posts 310, and the geometric centers of the corresponding through holes 110 and positioning holes 210, are aligned with one another.

The electronic device also includes a plurality of fasteners 40. The printed circuit board 10 is fixed on the panel 20 via the fasteners 40.

Figure 3:
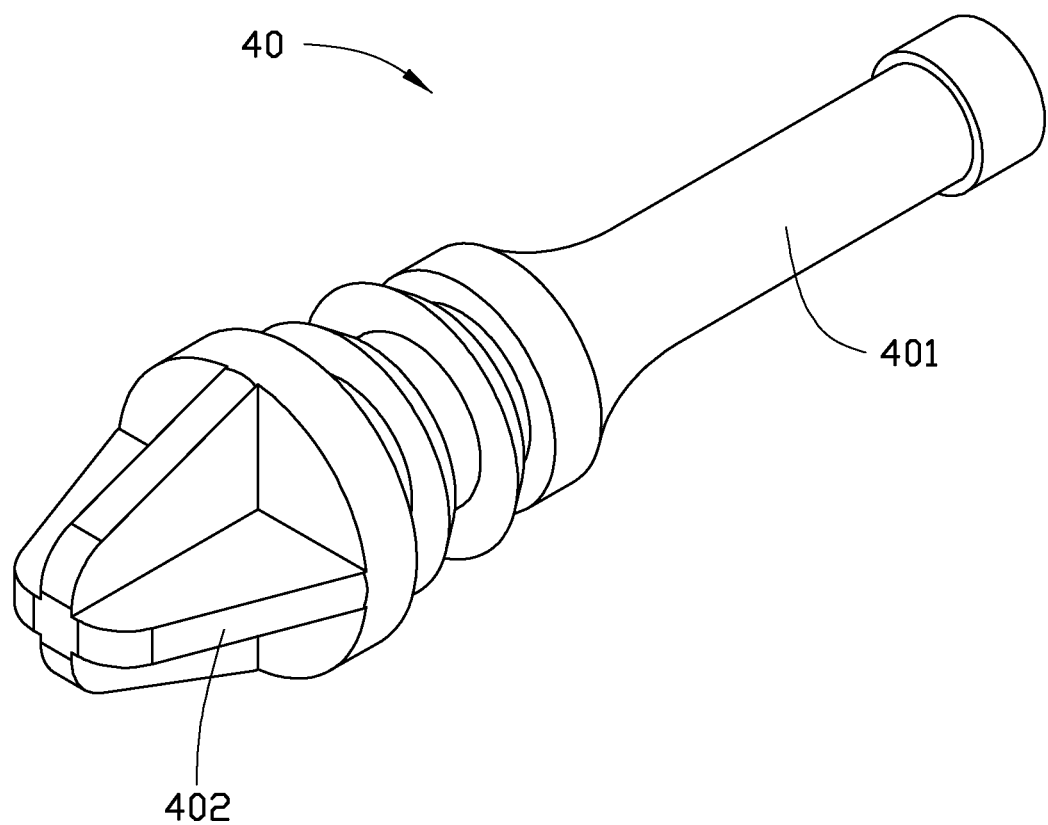
FIG. 3 is an enlarged, isometric view of one fastener seen in FIG. 2.

Referring to FIG. 3, each fastener 40 includes a first positioning part 401 and a second positioning part 402. The first positioning part 401 inserts through a corresponding through hole 110 and positioning hole 210 to connect the printed circuit board 10 and the panel 20. The second positioning part 402 is engagingly received in the engaging hole 3101 of a corresponding positioning post 310 of the shell 30.

The first positioning part 401 of the fastener 40 is made of rubber, and the second positioning part 402 of the fastener 40 is made of plastic. Further, the second positioning part 402 of the fastener 40 is generally in the shape of a truncated cone, and has a cross-shaped transverse cross-section. The cone-shaped configuration serves as a guide for inserting the second positioning part 402 into the engaging hole 3101 of the corresponding positioning post 310 of the shell 30.

Figure 5:
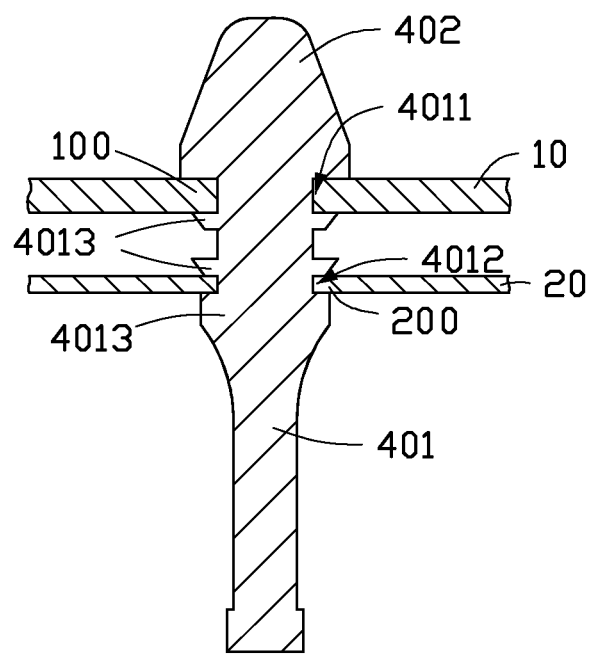
FIG. 5 is an enlarged, cross-sectional view of part of the electronic device of FIG. 1.

Referring to FIG. 5, the first positioning part 401 forms a first locking slot 4011 and a second locking slot 4012 therein. The first locking slot 4011 is annular, and located near the second positioning part 402. The second locking slot 4012 is annular, and located farther from the second positioning part 402 than the first locking slot 4011. A plurality of annular flanges 4013 is formed on the first positioning part 401. The annular flanges 4013 are spaced from each other. A diameter of each of the annular flanges 4013 is smaller than a largest diameter of the second positioning part 402 (at the inner end of the second positioning part 402). The first locking slot 4011 is defined between the second positioning part 402 and the annular flange 4013 that is nearest to the second positioning part 402. The second locking slot 4012 is defined between another two adjacent annular flanges 4013 farther from the second positioning part 402. Thus the first locking slot 4011 and the second locking slot 4012 are separated from each other a distance.

Figure 4:
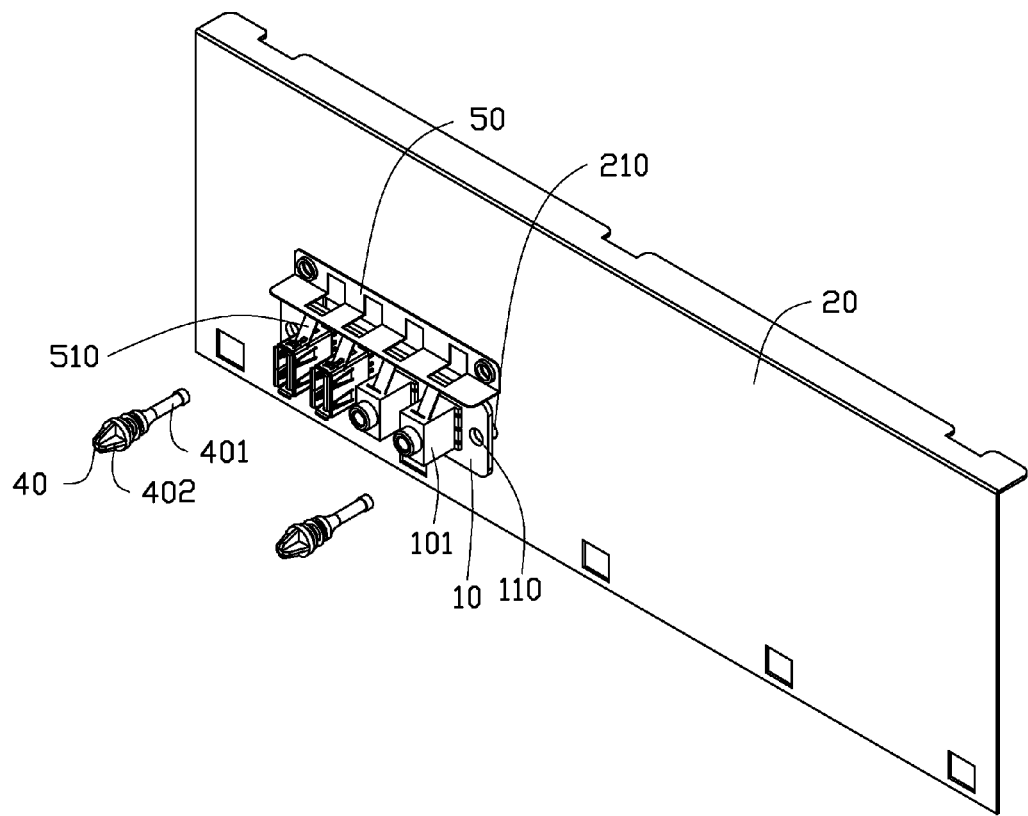
FIG. 4 is a partly exploded view of the panel and associated components of FIG. 1.

Referring to FIG. 2 and FIG. 4, the electronic device also includes a resilient holding bracket 50, which includes a plurality of resilient fingers 510. The resilient holding bracket 50 is an electromagnetic interference (EMI) shield, and can reduce electromagnetic radiation of the electronic device escaping to the outside. The resilient holding bracket 50 is fixed on the panel 20, and the resilient fingers 510 elastically press the connectors 101, respectively. In this embodiment, the resilient holding bracket 50 is riveted on the panel 20. In other embodiments, the resilient holding bracket 50 can be fixed on the panel 20 by screws or other fasteners.

Referring to FIG. 1, a plurality of rotators 321 are formed at a first long side of the shell 30, and a corresponding plurality of rotating holes 221 are defined in a first long side portion of the panel 20. A plurality of hooks 322 are formed along an opposite second long side of the shell 30, and a corresponding plurality of fastening grooves 222 are defined in an opposite second long side portion of the panel 20. The rotators 321 of the shell 30 match with the rotating holes 221 of the panel 20. The hooks 322 of the shell 30 match with the fastening grooves 222 of the panel 20.

In another embodiment, the plurality of rotators 321 are formed at a first short side of the shell 30, and the corresponding plurality of rotating holes 221 are defined in a first short side portion of the panel 20. The plurality of hooks 322 are formed along an opposite second short side of the shell 30, and the corresponding plurality of fastening grooves 222 are defined in an opposite second short side portion of the panel 20.

Referring to FIG. 4 and FIG. 5, in assembly of the electronic device, the first positioning part 401 of each fastener 40 is inserted through the corresponding through hole 110 of the printed circuit board 10 and the corresponding positioning hole 210 of the panel 20 in that order to secure the printed circuit board 10 onto the panel 20. In detail, an annular first edge portion 100 of the printed circuit board 10 surrounding the through hole 110 of the printed circuit board 10 is engagingly received in the first locking slot 4011 of the first positioning part 401. Similar, an annular second edge portion 200 of the panel 20 surrounding the positioning hole 210 of the panel 20 is engagingly received in the second locking slot 4012 of the first positioning part 401. Referring to FIG. 1, the shell 30 engages the panel 20, and the printed circuit board 10 is located between the shell 30 and the panel 20. The second positioning parts 402 are engagingly received in the engaging holes 3101 of the positioning posts 310. Accordingly, the connectors 101 of the printed circuit board 10 are extended through the holes 301 of the shell 30 to be exposed out of the shell 30. Thus exterior devices (not shown) such as an input device, an output device, etc. are able to connect the connectors 101.

In the present disclosure, the first positioning part 401 of each fastener 40 is inserted through the corresponding through hole 110 and the corresponding positioning hole 210 to connect the printed circuit board 10 and the panel 20. The second positioning part 402 of each fastener 40 is engagingly received in the engaging hole 3101 of the corresponding positioning post 310 of the shell 30. The panel 20, the printed circuit board 10 and the shell 30 are connected to each other precisely by the fasteners 40; and the through holes 110, the positioning holes 210 and the engaging holes 3101 are kept aligned with each other by the fasteners 40. This helps avoid deviation of the positions of the connectors 101 relative to the position of the holes 301 of the shell 30.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. An electronic device comprising:
a panel, defining a plurality of positioning holes therein;
a printed circuit board arranged on the panel, the printed circuit board having a plurality of connectors arranged thereon, and the printed circuit board defining a plurality of through holes therein;
a shell combined with the panel and covering the printed circuit board, the shell defining a plurality of holes therein, a plurality of positioning posts formed on the shell, each positioning post defining a engaging hole therein, and the connectors extending through the holes of the shell; and
a plurality of fasteners combined with the panel, the printed circuit board and the shell, each fastener comprising a first positioning part and a second positioning part, the first positioning part inserted through a corresponding through hole and a corresponding positioning hole thereby connecting the printed circuit board and the panel, and the second positioning part engagingly received in the engaging hole of a corresponding positioning post of the shell.

2. The electronic device of claim 1, further comprising a resilient holding bracket, arranged on the panel, wherein the resilient holding bracket comprises a plurality of resilient fingers, and the resilient fingers elastically press the connectors, respectively.

3. The electronic device of claim 2, wherein the resilient holding bracket is an electromagnetic interference (EMI) shield.

4. The electronic device of claim 1, wherein the first positioning part of each fastener is made of rubber, and the second positioning part of the fastener is made of plastic.

5. The electronic device of claim 1, wherein the second positioning part of each fastener is in a shape of a truncated cone.

6. The electronic device of claim 5, wherein the second positioning part of the fastener has a cross-shaped transverse cross-section.

7. The electronic device of claim 1, wherein a plurality of rotators are formed in a first side of the shell, and a corresponding plurality of rotating holes are defined in a first side of the panel, a plurality of hooks are formed along an opposite second side of the shell, and a corresponding plurality of fastening grooves are defined in an opposite second side of the panel, the rotators of the shell match with the rotating holes of the panel, and the hooks of the shell match with the fastening grooves of the panel.

8. The electronic device of claim 1, wherein the first positioning part of each fastener comprises a first locking slot and a second locking slot, an annular first edge portion of the printed circuit board surrounding the corresponding through hole of the printed circuit board is engagingly received in the first locking slot, and an annular second edge portion of the panel surrounding the corresponding positioning hole of the panel is engagingly received in the second locking slot.

9. The electronic device of claim 8, wherein a plurality of annular flanges spaced from each other are formed on the first positioning part of the fastener, the first locking slot is defined between the second positioning part and one of the annular flanges adjacent to the second positioning part, and the second locking slot is defined between two another annular flanges of the first positioning part.

10. An electronic device comprising:
a first enclosure part, defining a plurality of positioning holes therein;

a printed circuit board arranged on the first enclosure part, the printed circuit board having a plurality of connectors arranged thereon, and the printed circuit board defining a plurality of through holes therein;

a second enclosure part combined with the first enclosure part and covering the printed circuit board, the second enclosure part defining a plurality of holes therein, a plurality of positioning posts formed on the second enclosure part, each positioning post defining a engaging hole therein, and the connectors extending through the holes of the second enclosure part; and a plurality of fasteners combined with the first enclosure part, the printed circuit board and the second enclosure part, each fastener comprising a first positioning part and a second positioning part, the first positioning part inserted through a corresponding through hole and a corresponding positioning hole thereby connecting the printed circuit board and the first enclosure part, and the second positioning part engagingly received in the engaging hole of a corresponding positioning post of the second enclosure part.

\* \* \* \* \*